United States Patent [19]
Huang et al.

[11] Patent Number: 5,917,210
[45] Date of Patent: Jun. 29, 1999

[54] FLAT PANEL IMAGING DEVICE

[75] Inventors: Zhong Shou Huang, Etobicoke; John Wright, Brampton, both of Canada

[73] Assignee: Litton Systems Canada Limited, Rexdale, Canada

[21] Appl. No.: 08/860,544

[22] PCT Filed: Jan. 19, 1995

[86] PCT No.: PCT/CA95/00030

§ 371 Date: Jun. 30, 1997

§ 102(e) Date: Jun. 30, 1997

[87] PCT Pub. No.: WO96/22616

PCT Pub. Date: Jul. 25, 1996

[51] Int. Cl.[6] .................................................... G02F 1/13
[52] U.S. Cl. ............................................................ 257/292
[58] Field of Search ............................... 257/59, 72, 292, 257/444, 448

[56] References Cited

U.S. PATENT DOCUMENTS

| | | |
|---|---|---|
| 4,636,038 | 1/1987 | Kitahara et al. . |
| 5,650,636 | 7/1997 | Takemura et al. . |

FOREIGN PATENT DOCUMENTS

| | | |
|---|---|---|
| 0 403 279 A1 | 6/1990 | European Pat. Off. . |
| 0 570 257 A1 | 5/1993 | European Pat. Off. . |
| 56138961 | 10/1981 | Japan . |
| 5055576 | 3/1993 | Japan . |

OTHER PUBLICATIONS

W. Zhao, et al., "A large area solid–state detector for radiology using amorphous selenium," *Medical Imaging VI: Instrumentation,* (Feb. 1992), SPIE vol. 1651, pp. 134–143.

I. Fujieda, et al., "High Sensitivity Readout of 2D a–Si Image Sensors," *Jpn. J. Appl. Phys.,* (1993) vol. 32, pp. 198–204.

K. Tanaka, et al. "Characteristics of Field–Induced–Drain (FID) Poly–Si TFT's with High ON/OFF Current Ratio," *IEEE Transactions on Electron Devices,* (Apr. 1992) vol. 39, No. 4.

*Primary Examiner*—Jerome Jackson, Jr.
*Attorney, Agent, or Firm*—Fay, Sharpe, Beall, Fagan, Minnich & McKee, LLP

[57] ABSTRACT

A novel thin film transistor (TFT) structure for minimizing parasitic capitances on both the drain and source electrodes. According to a first embodiment, a triple gate TFT is provided with an open gate structure in which the source and drain electrodes are non-overlapping with the top gate electrode. A pair of bottom gate electrodes being aligned respectively with the first gap between the gate and source and the second gap between the gate and drain. According to a second embodiment of the invention, a full transfer TFT switch is provided having a source, a drain, a bottom gate and semi-conductor layer therebetween, and a partial top gate overlapping a portion of the drain and a portion of the semiconductor layer for creating a generally triangular-shaped charge density distribution in the semiconductor layer for moving channel electrons toward the source electrode.

6 Claims, 5 Drawing Sheets

FLAT PANEL IMAGING DEVICE

FIELD OF THE INVENTION

This invention relates in general to thin film transistors (TFTs) and more particularly to a pair of novel TFT structures exhibiting reduced parasitic capacitance.

BACKGROUND OF THE INVENTION

As a consequence of recent rapid development of flat panel display technologies, thin film transistors (TFTs) are being actively utilized in the implementation of two types of large area electronic devices, namely liquid crystal displays (LCDs) and flat-panel imaging devices. These devices generally comprise a large number of TFTs, which act as switches or amplifiers.

As is well known in the art, a typical TFT is constructed using a MOS structure (metal oxide semiconductor) comprising a semiconductor film, a gate electrode, a gate dielectric film, source and drain electrodes. The semiconductor film can be fabricated from amorphous silicon (a-Si), poly-silicon (poly-Si), cadmium selenide (CdSe), or other suitable semiconductor material. The metal material of the electrodes can be fabricated from chromium or aluminium. The material of the dielectric film is fabricated typically from one of either silicon nitride, silicon oxide or various anodic oxide films.

As is well known, MOS transistors are normally provided with an overlapping area between the gate and source and between the gate and drain electrodes, to ensure continuity of the channel formed in the semiconductor layer. Generally, the overlapping area should be no less than the design rule of a particular TFT device. Two parasitic capacitances (Cgs and Cgd) are formed in the overlapping areas between gate and source and between gate and drain, respectively. As a consequence of these known parasitic capacitances, gate control pulses are known to feedthrough the semiconductor layer into the source or drain, thereby deteriorating switching performance. While this is a well known common problem for all MOS transistors, the problem is exacerbated in large area TFT matrix applications where design rules must provide sufficiently large tolerances, corresponding to the lithographic tolerances of the fabrication process on a large size exposure area.

When a TFT switch turns off, the feedthrough charge comes from two components. The first is the differential component of the gate pulse on the parasitic capacitor, and the other results from channel electrons which are split away and squeezed into the source and drain electrodes (Z. S. Huang, Y. Katayama and T. Ando, "The dependence of the parasitic capacitance and the reset potential level in a solid-state imaging sensor," Proceedings of the Joint Meeting of 1989 Electric & Electronic Institutes, Tokai Shibu, Japan, P. 325, October (1989) and Z. S. Huang and T. Ando, "An analysis of reset mechanism in a stacked and amplified imaging sensor," Journal of the Institute of Television Engineers of Japan, Vol. 46, no. 5, pp. 624–631, May (1992)).

For a TFT-LCD, when the TFT turns off, negative charges are left on the pixel capacitor, causing the bias voltage of the liquid crystal to drop. This is equivalent to applying a DC voltage directly on the liquid crystal. This DC bias voltage causes the characteristics of the liquid crystal to shift in one direction, causing crosstalk. Moreover, because the capacitances of a liquid crystal in the ON and OFF states are different, feedthrough charges generate different feedthrough voltage shifts for "white" and "black" pixels. This causes image sticking and flicker noise in the TFT-LCD, a phenomenon referred to as "image persistence" in I-Wei Wu, "High-definition displays and technology trends in TFT-LCD", Journal of the SID, 2/1, pp. 1–14 (1994).

The problem of feedthrough charges in TFT LCD applications is less serious when compared to the problem of feedthrough charges in imaging sensors since the signal voltage is extremely small. Feedthrough charges in imaging applications can result in saturation of the feedback capacitor in the readout charge amplifier of a TFT matrix causing latch-up of the amplifier. One solution to this problem involves incorporating a larger feedback capacitor in the charge amplifier. However, that approach sacrifices the sensitivity of the amplifier, as discussed in I. Fujieda et al., "High sensitivity readout of 2D a-Si image sensors," Japanese Journal of Applied Physics, Vol. 32, pp. 198–204 (1993).

Furthermore, feedthrough charges in imaging applications affect not only the source or output portion of the TFT but also the drain or pixel electrode portion. In this case, excessive negative charge fed into the pixel capacitor can prevent the TFT from turning off so that charge leaks into the data line. For high-level incident light or radiation, the leakage current drops quickly, whereas for low level light or radiation, the leakage current can remain high before a subsequent charge readout. This can result in crosstalk or smearing of the image along the data line and a consequential deterioration of image quality.

Several TFT structures and specialized driving schemes have been proposed to alleviate the problem of image quality deterioration caused by charge feedthrough in TFT arrays. The most common prior art approach involves incorporating an additional storage capacitor in each pixel of the TFT array. However, that approach suffers from the disadvantage of decreasing the fill factor of the TFT imager or LCD and increasing the probability of an interlayer short circuit.

Self-alignment fabrication processes constitute another approach to reducing parasitic capacitances. Using self-aligned techniques, a channel length can be created which is almost exactly the same length as the bottom gate by using the bottom gate pattern as a photo-mask and flooding the backside of the glass substrate with ultraviolet light, as discussed in the reference of I-Wei Wu cited above. There are two known types of self-alignment TFT structures. The first is referred to as the "non-complete" self-alignment type TFT, which is capable of reducing parasitic capacitance but incapable of removing it completely. The second is referred to as the "complete" self-alignment type TFT, in which lift-off techniques are utilized. However, the lift-off techniques contribute to complexity of the fabrication process and cannot be used for a top gate TFT structure, which is the preferred structure for many imaging sensors such as the amorphous selenium/cadmium selenide TFT SAMURAI radiation imaging sensor (W. Zhao and J. A. Rowlands "A large area solid-state detector for radiology using amorphous selenium," SPIE Vol. 1651, Medical Imaging VI: Instrumentation, pp. 134–143, (1992)).

In terms of prior art driving schemes, four kinds of LCD driving methods (Frame inversion, Gate line inversion, Data line inversion and Dot inversion method) have been proposed (Reference: I-Wei Wu, "High-definition displays and technology trends in TFT-LCDs," Journal of the SID, vol. 2, no. 1, pp. 1–14, 1994). These driving methods change the polarity of bias voltage on the liquid crystal film periodically, and they reduce the sticking and crosstalk effects by averaging noise in the time or spatial domains.

However, none of these is capable of driving an imaging sensor, because changing polarity of bias voltage on a detector film is usually not allowed. Most of these prior art photodetectors do not show symmetric characteristics as altering the polarity of bias voltage. Furthermore, it is difficult to change the polarity of bias voltage in some X-ray detectors such as a-Se or a-Si x-ray detectors, where the bias voltage can be tens of KV.

Another prior art approach to solving the problem of parasitic capacitances is the use of a dual gate MOSFET comprising two series connected FETs fabricated on a silicon substrate (N. Ditrick, M. M. Mitchell and R. Dawson, "A low power MOS tetrode", Proceedings of International Electron Device Meeting, 1965). This device is known to be characterized by relatively low switching noise. When the dual gate FET is used as a switch, one gate is grounded and the other gate is connected to a gate control pulse for turning on and turning off the switch. Since the feedthrough charge is shunted to ground for the control gate, the capacitance Cgd equals zero. However, this dual gate structure cannot be applied to TFT-LCDs or TFT image sensors without decreasing the fill-factor.

Neither the self-alignment type TFT nor the dual gate TFT discussed above, eliminate feedthrough resulting from split channel electrons.

In addition to the problems mentioned above, the split channel electrons also cause partition noise in the imaging sensors, as described by N. Teranishi et al in the paper: "Partition noise in CCD signal detection," IEEE Trans. on Electron Devices, vol. 33, no. 11, pp. 1696–1701. The partition noise is proportional to the channel area, in which electrons are pumped in and pumped out.

SUMMARY OF THE INVENTION

According to one embodiment of the present invention a novel TFT structure is provided which is characterized by no parasitic capacitance on either the drain or the source electrodes. According to this embodiment, a triple gate TFT is provided in an open gate structure (i.e. the top gate is shorter than the distance between source and drain electrodes). Two bottom gates are provided, preferably in the form of metal strips, which are aligned with the two gaps between the source and top gate and between the drain and top gate, respectively. As an alternative to depositing two gates on the bottom of the TFT, such gates can also advantageously be deposited over the top gate. During imaging operation and readout, the two additional gates are connected to a voltage source for turning on the channel areas covered thereby.

Parasitic capacitance develops between the bottom gate and source drain electrodes, and the bottom gate and the top gate. However, since there is no overlapped area between top gate and source and drain electrode, the parasitic capacitances between them are negligible. Since the bottom gate is connected to a predetermined voltage (e.g. actual ground) during operation, there is no charge fed into the pixel or data line through the parasitic capacitance between bottom gate and source or drain electrode. A gate control pulse is applied to the top gate to turn the switch on or off.

According to a second embodiment of the present invention, a novel TFT switch is provided having extremely small split charge to the drain terminal, for use in an image sensor. This TFT design is referred to herein as a full-transfer TFT switch. This switch comprises a partial top gate overlying a portion of the TFT channel and a portion of the pixel electrode of the conventional bottom gate TFT. The partial top gate is biased to a suitable voltage to create a triangle-shaped charge density distribution in the TFT channel. Most channel electrons are therefore repelled by the triangular potential barrier toward the source electrode, with only a very small portion of channel electrodes splitting away and flowing into the drain electrode (i.e. the pixel electrode in an image sensor).

BRIEF DESCRIPTION OF THE DRAWINGS

A detailed description of the two principal embodiments of the present invention is provided hereinbelow with reference to the following drawings in which:

FIG. 1b is an equivalent circuit for the TFT structure of FIG. 1a;

DETAILED DESCRIPTION OF THE PREFERRED EMBODIMENTS

Figure 1A:
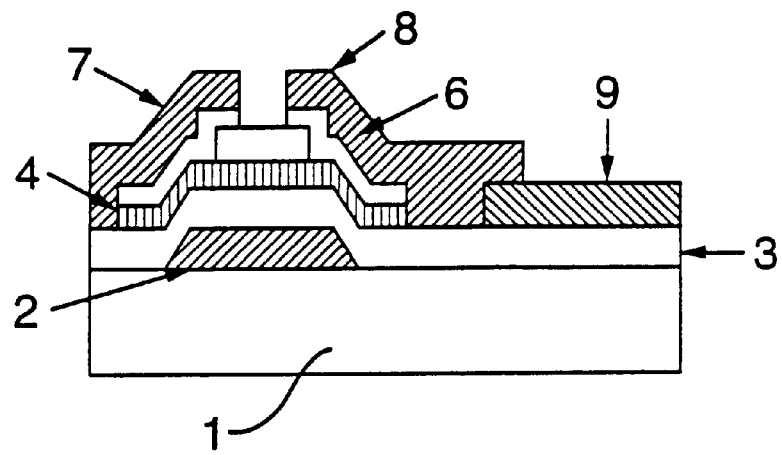
FIG. 1a is a cross section view of a single pixel of a prior art TFT array used in a TFT-LCD or TFT imaging sensor.
Figure 1B:
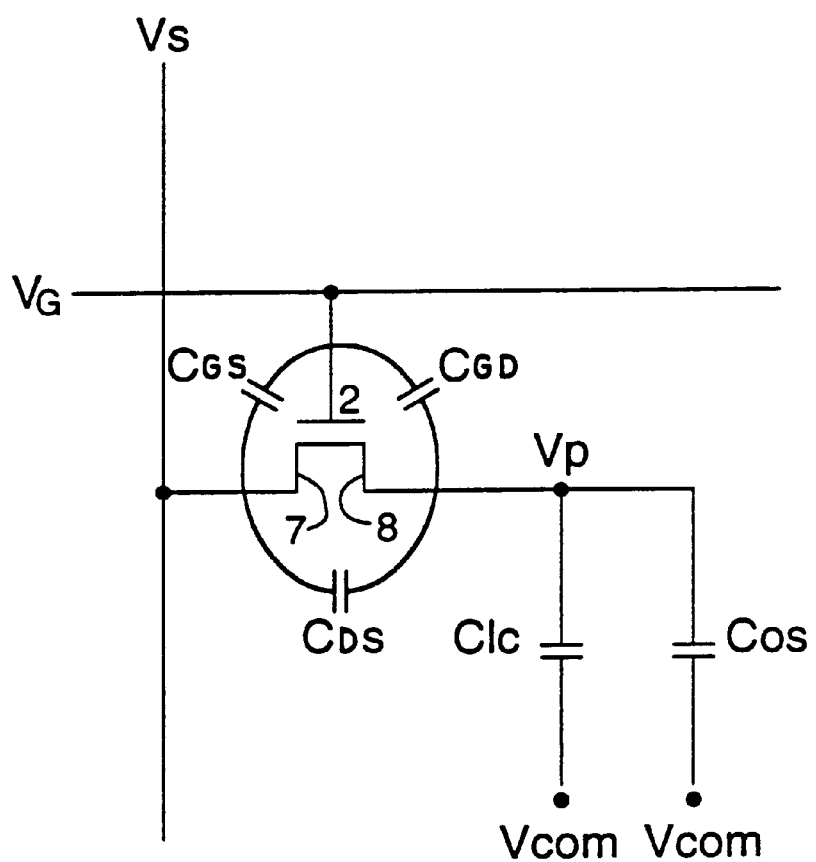

With reference to FIG. 1a, a cross-sectional view of a prior art pixel is shown for use in a TFT-LCD or TFT image sensor. This prior art TFT structure comprises a glass substrate 1, a gate 2 deposited on the glass substrate, a gate insulator 3 deposited over the gate 2, a layer of semiconductor 4 deposited on the gate insulator 3 and overlying gate 2, a passivation layer 5 deposited on semiconductor layer 4, a contact layer 6 deposited on the semiconductor layer 4 and passivation layer 5, and source and drain electrodes 7 and 8 deposited on the contact layer 6. An ITO layer 9 is connected to drain 8 for extending over the pixel area. The equivalent circuit is illustrated in FIG. 1b, further showing the storage capacitor $C_{st}$ connected to a bias voltage $V_{com}$. $V_{com}$ is at ground or other predetermined potential level, if an independent metal line is used for the storage capacitor. Source 7 is shown connected to a readout line for conveying an output voltage $V_s$, and gate 2 is connected to a control line for receiving control pulse $V_g$ for enabling the transistor. The three parasitic capacitors are illustrated: $C_{gs}$, $C_{gd}$, $C_{ds}$. The pixel voltage on ITO layer 9 is designated in FIG. 1b as $V_{com}$. The capacitor $C_{LC}$ represents the capacitance of liquid crystal overlaid on one pixel area of the TFT panel.

Figure 2:
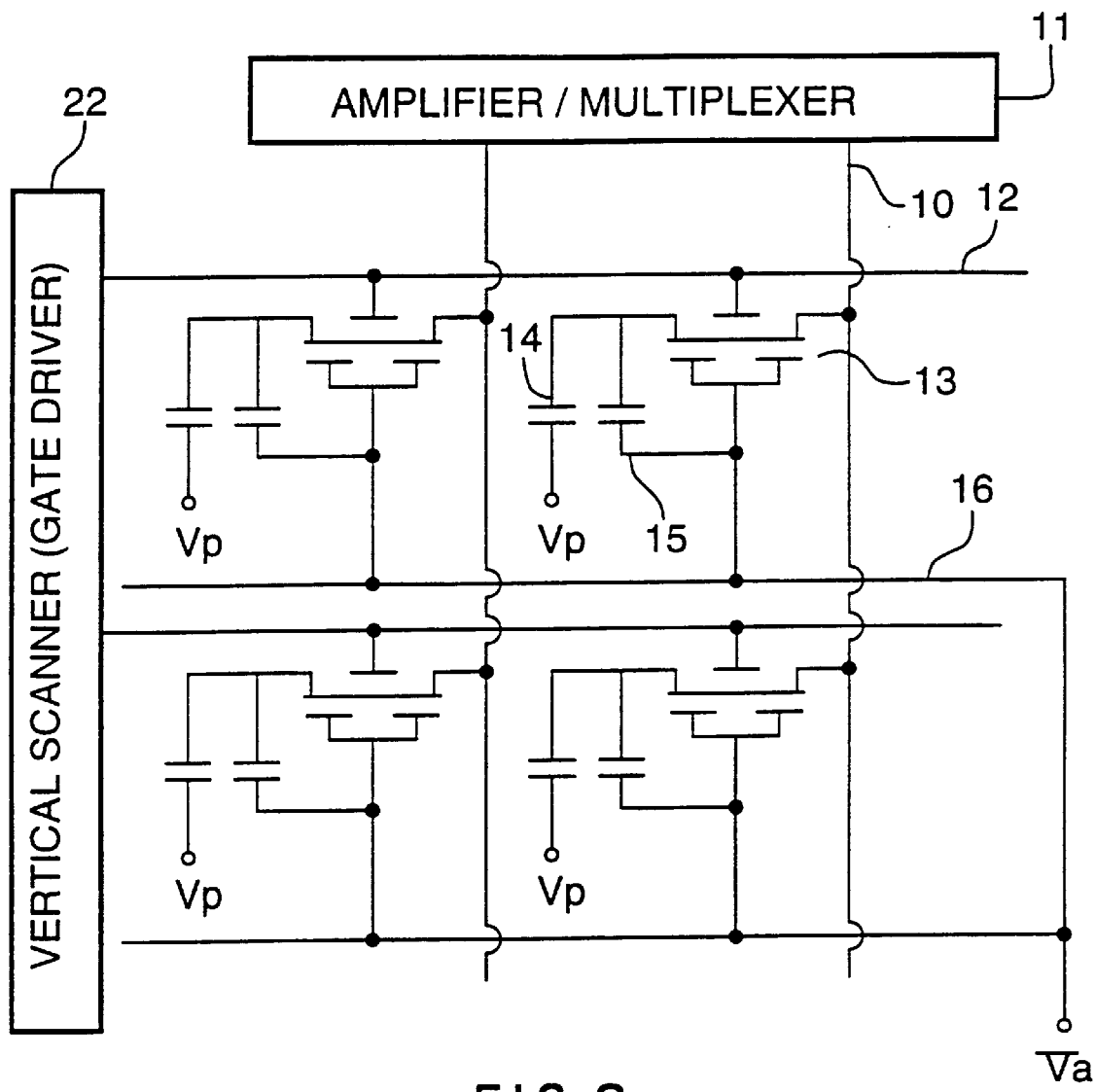
FIG. 2 is an equivalent circuit of a TFT imaging sensor with triple gate TFT switch in each pixel, according to a first embodiment of the invention.

Turning to FIG. 2, an equivalent circuit of the triple gate TFT structure of the first embodiment of the present invention is shown in an imaging array. The array comprises a plurality of readout columns 10 connected to an amplifier/multiplexer 11, and a plurality of gate lines 12 connected to a vertical scanner (gate driver) 22. Each pixel includes a triple gate TFT switch 13, discussed in greater detail below with reference to FIGS. 3 and 4. The drain of TFT switch 13 is connected to one terminal of a selenium radiation detecting capacitor 14 and one terminal of a storage capacitor 15. The other terminal of selenium capacitor 14 is connected to a source of high voltage $V_{com}$, while the two bottom gates of TFT switch 13 are connected to the second terminal of storage capacitor 15 and an additional source of bias voltage $V_a$ via line 16.

Figure 3:
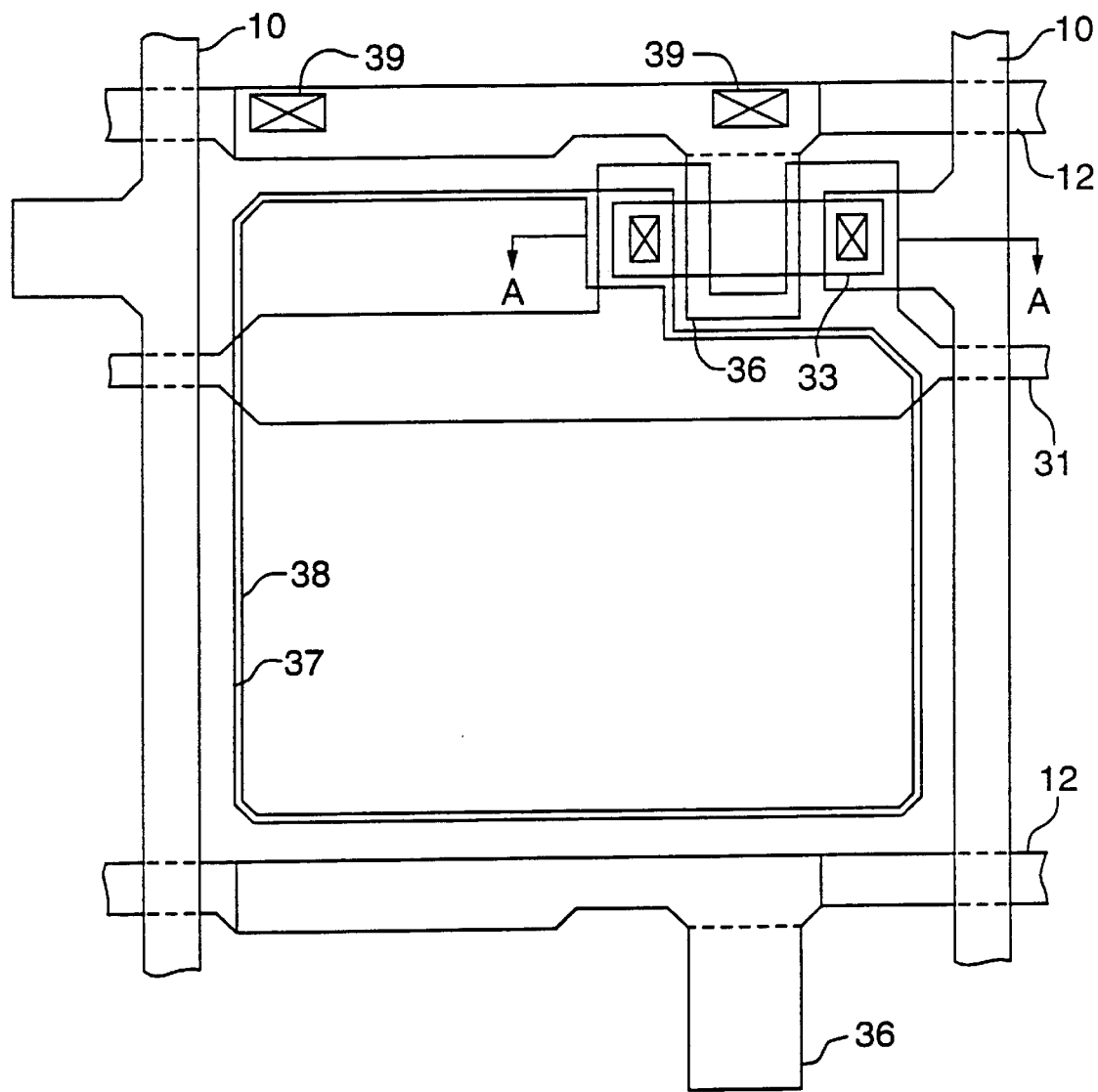
FIG. 3 is a layout of a single pixel with the triple gate TFT of FIG. 2.
Figure 4:
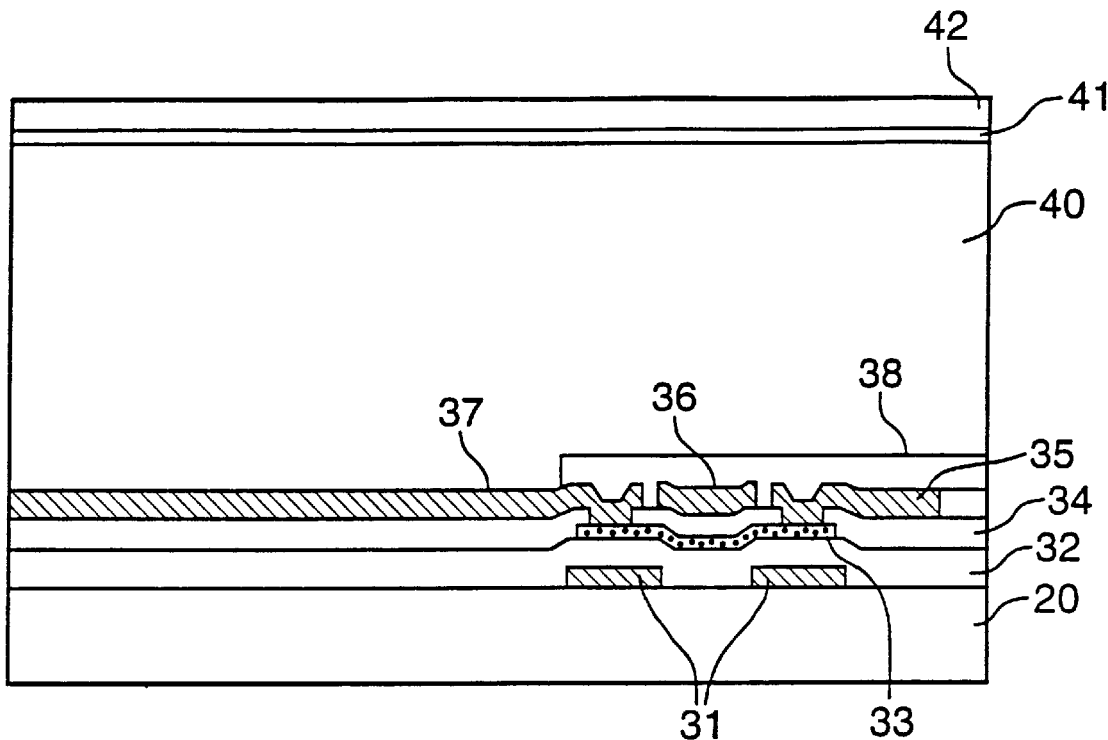
FIG. 4 is a cross-section view through the lines 4—4 in FIG. 3.

Turning to FIG. 3, the layout is shown of a single pixel for the imaging sensor of FIG. 2. FIG. 4 is a cross-section through the line A—A in FIG. 3. A pair of bottom gates 31 are disposed on a glass substrate 20, and a gate insulator 32 is deposited over the bottom gates 31, as shown in FIG. 4. Next, a layer of semiconductor 33 is deposited over the bottom gates 31 and a passivation layer 34 is deposited and patterned for source and drain access. Source electrode 35 and drain electrode 37 are then deposited on passivation layer 34 and extend through respective vias to contact semiconductor layer 33. Drain electrode 37 extends to form a pixel electrode 37 (FIG. 3). A top gate 36 is deposited over passivation layer 34 intermediate the source and drain electrodes 35 and 37 according to an open gate structure. Top gate 36 contacts the horizontal gate line 12 through contact via 39.

A layer of amorphous selenium is deposited over the entire TFT matrix to a thickness of approximately 300 mm. Next, an injection blocking layer 41 is deposited over is the amorphous selenium layer, and a top electrode 42 is deposited over the injection blocking layer. The blocking layer 41 reduces charge-injection from top electrode 42, and therefore decreases the dark current of the a-Se film. The technology is discussed in greater detail in: Eiichi Maruyama, "Amorphous built-field effect photoreceptors," Japanese Journal of Applied Physics, vol. 21, no. 2, pp. 213–223, 1982.

The passivation layer 38 covers the entire area except the pixel electrode 37, which allows photogenerated charges to arrive at the pixel electrode 37 and protects the other area elements such as the TFT switch. In FIG. 3, a large hole is shown through passivation layer 38 on the pixel electrode 37.

In operation, a high voltage is applied between the top electrode 42 and pixel electrode 37. Electron-hole pairs are generated in the amorphous selenium layer 40 in response to exposure to radiation (e.g. x-rays). These free charges drift towards respective ones of the electrodes 42 and 27. Accordingly, charges collected on pixel electrode 37 are proportional to the amount of radiation incident upon amorphous selenium layer 40, on a per pixel basis. Charge is read out from the pixel 37 in response to enabling the TFT switch via a control pulse on the top gate 36. As discussed above, with the open gate structure of FIGS. 3 and 4, source and drain parasitic capacitances between the top gate 36 are completely eliminated. In order to ensure complete conduction of the semiconductor layer 33 throughout the transistor channel, a suitable potential $V_a$ is applied to the bottom gates 31 during the image readout.

Figure 5:
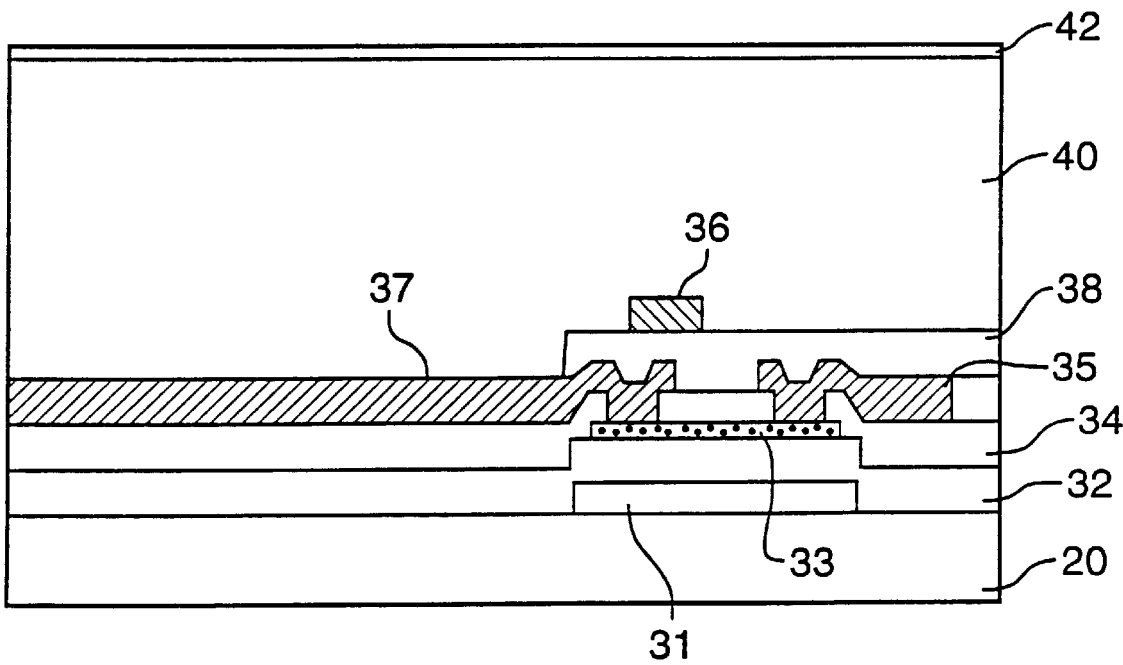
FIG. 5 is a cross-section view of a radiation imaging sensor pixel with full transfer TFT switch in accordance with a second embodiment of the invention.

Turning now to the embodiment of FIG. 5, like numerals denote the same components as illustrated in FIGS. 2, 3 and 4. As an option, a blocking layer of charge injection can be added to the cross-section view of FIG. 5 for decreasing the dark current of the a-Se film.

Instead of utilizing an open gate structure as shown in FIGS. 3 and 4, this embodiment utilizes a conventional TFT structure with single bottom gate 31 extending beneath the length of semiconductor layer 33. However, in this embodiment, a narrow metal strip 36 (i.e. partial top gate) is deposited on passivation layer 38 partially covering the TFT channel and the pixel electrode 37. Partial top gate 36 is biased to an appropriate potential by connecting it either to an adjacent pixel electrode or to an independent bias line (not shown).

Figure 6:
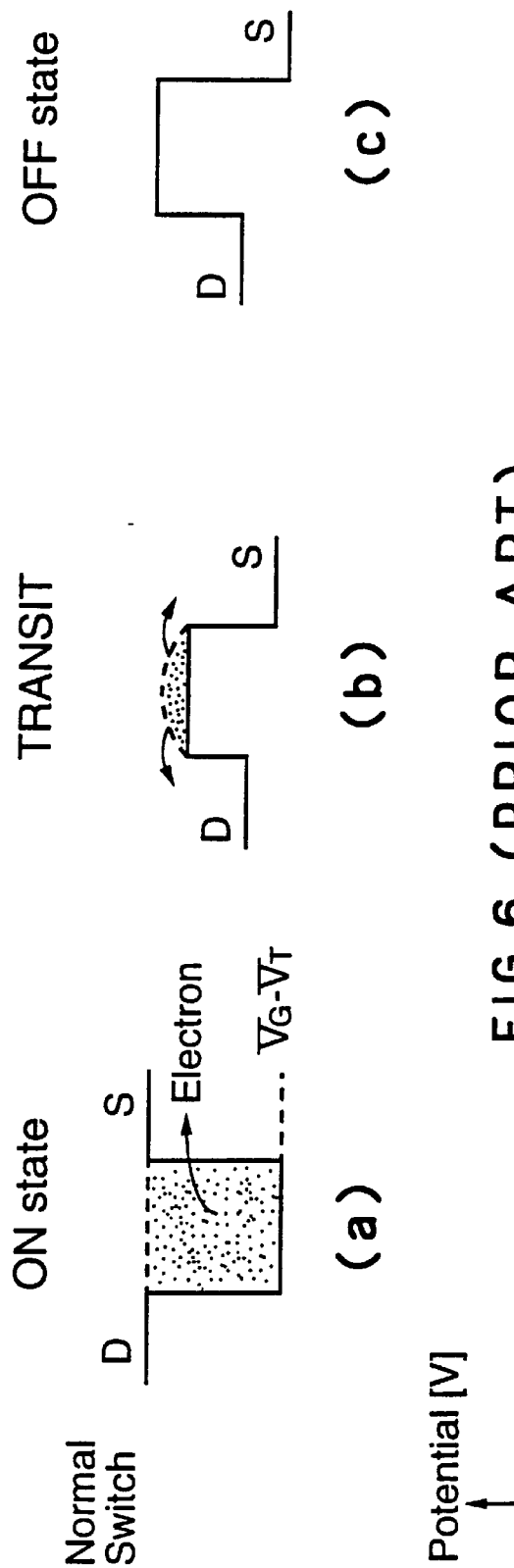
FIG. 6 comprises parts a, b, and c, and shows potential well diagrams for explaining the operating principles of the prior art normal switch of FIG. 1.

Turning to FIGS. 6a, 6b and 6c, potential well diagrams are shown for a conventional TFT switch. In the ON state (FIG. 6a), electrons are trapped in the potential well created in semiconductor layer 33 via gate 31. The depth of the well is governed by the gate voltage $V_g$ minus the transistor threshold voltage $V_t$. When the conventional TFT switches from the ON state to the OFF state, channel electrons are squeezed towards both the drain and source electrodes as shown in FIG. 6b, with the OFF state potential well diagram being as shown in FIG. 6c.

Figure 7:
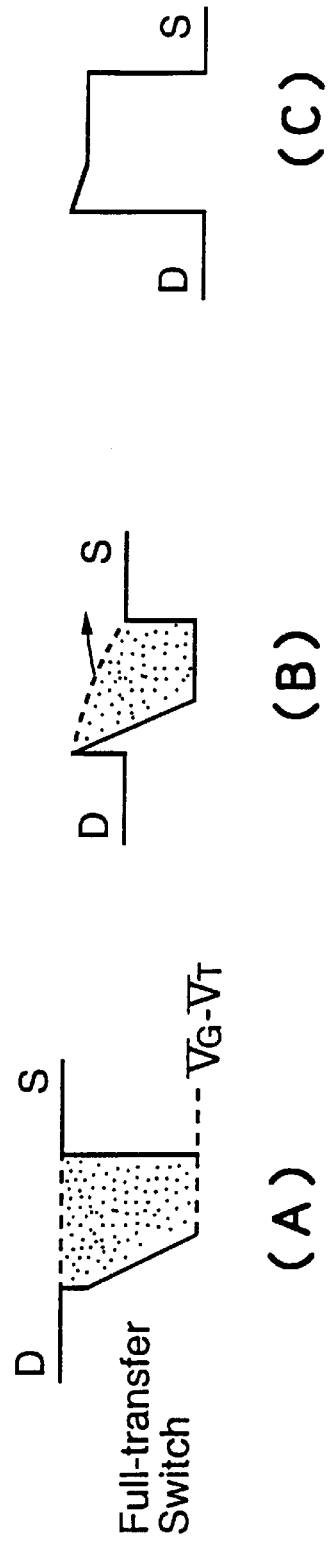
FIG. 7 comprises parts a, b, and c, and shows potential well diagrams for explaining the operating principles of the full-transfer switch of FIG. 5.

In accordance with the full transfer TFT switch structure of FIG. 5, the voltage applied to partial top gate 36 is adjusted so as to create a triangle-shaped charge density distribution in the TFT channel, as shown in FIG. 7a. Consequently, as the transistor switches from the ON state through transition to the OFF state, the majority of channel electrons are pushed by the triangle-shaped potential barrier toward the source electrode 35, as shown in FIG. 7b, with only a very small portion of channel electrons splitting away and flowing into the drain or pixel electrode 37. The OFF state potential well diagram for the full transfer TFT switch of FIG. 5 is shown in FIG. 7c.

A person skilled in the art understanding the present invention may conceive of other embodiments and modifications thereof without departing from the sphere and scope of the invention defined by the claims appended hereto.

The embodiments of the invention in which an exclusive property of privilege is claimed are defined as follows:

1. In a bottom gate thin-film transistor having a source, a drain, a bottom gate and a semiconductor layer therebetween, the improvement comprising a partial top gate overlapping a portion of said drain and a portion of said semiconductor layer for creating a generally triangle-shaped charge density distribution in said semiconductor layer thereby moving a majority of free charges in said semiconductor layer toward said source.

2. A radiation imaging sensor, comprising:
   a) a substrate;
   b) a bottom gate electrode deposited on said substrate;
   c) a gate insulator deposited on said bottom gate electrode;
   d) a semiconductor layer deposited on said gate insulator so as to substantially overlie said bottom gate electrode;
   e) a passivation layer deposited on said semiconductor layer;
   f) source and drain electrodes deposited on and extending through said passivation layer;
   g) a further passivation layer deposited on said source and drain electrodes;
   h) a pixel electrode extending from said drain electrode;
   i) a partial top gate electrode deposited on said passivation layer and overlapping a portion of said drain and a portion of said semiconductor layer for creating a generally triangle-shaped charge density distribution in said semiconductor layer thereby moving a majority of free charges in said semiconductor layer toward said source;

j) a radiation detection layer deposited on said pixel electrode; and k) a top electrode overlying said radiation detection layer, whereby charges are collected on said pixel electrode in response to a high voltage potential being applied between said top electrode and said pixel electrode, said charges being proportional to the amount of radiation incident on said radiation detection layer, and wherein said charge is transferred from said pixel electrode to said source electrode via said drain electrode in response to predetermined gate bias voltages being applied to said partial top gate electrode and said bottom gate electrodes.

3. The radiation imaging sensor of claim 2, wherein said semiconductor layer is fabricated from amorphous silicon.

4. The radiation imaging sensor of claim 2, wherein said semiconductor layer is fabricated from poly-silicon.

5. The radiation imaging sensor of claim 2, wherein said semiconductor layer is fabricated from cadmium selenide.

6. The radiation imaging sensor of claim 2, wherein said radiation detection layer is fabricated from amorphous selenium, amorphous silicon or CdTe/Cds X-ray detector.

* * * * *

UNITED STATES PATENT AND TRADEMARK OFFICE
CERTIFICATE OF CORRECTION

PATENT NO. : 5,917,210
DATED : 6/29/99
INVENTOR(S) : HUANG, Zhong and WRIGHT, John It is certified that error appears in the above-identified patent and that said Letters Patent is hereby corrected as shown below:

In column 5, line 28,

"300mm" should be --300 $\mu$m--.

Signed and Sealed this

Twenty-fifth Day of January, 2000

Attest:

Attesting Officer

Acting Commissioner of Patents and Trademarks